(12) United States Patent
Han

(10) Patent No.: US 9,459,480 B2
(45) Date of Patent: Oct. 4, 2016

(54) DISPLAY DEVICE AND MANUFACTURING METHOD THEREOF

(71) Applicant: Samsung Display Co., Ltd., Yongin, Gyeonggi-Do (KR)

(72) Inventor: Eun Hee Han, Seoul (KR)

(73) Assignee: Samsung Display Co., Ltd. (KR)

( * ) Notice: Subject to any disclaimer, the term of this patent is extended or adjusted under 35 U.S.C. 154(b) by 24 days.

(21) Appl. No.: 14/476,382

(22) Filed: Sep. 3, 2014

(65) Prior Publication Data

US 2015/0301374 A1     Oct. 22, 2015

(30) Foreign Application Priority Data

Apr. 18, 2014   (KR) .......................... 10-2014-0046961

(51) Int. Cl.
| | | |
|---|---|---|
| H01L 29/66 | (2006.01) | |
| G02F 1/1333 | (2006.01) | |
| H01L 27/12 | (2006.01) | |
| G02F 1/1339 | (2006.01) | |
| G02F 1/1343 | (2006.01) | |

(52) U.S. Cl.
CPC ....... *G02F 1/133377* (2013.01); *G02F 1/1343* (2013.01); *G02F 1/13394* (2013.01); *H01L 27/124* (2013.01); *H01L 27/1259* (2013.01)

(58) Field of Classification Search
CPC ........... G02F 1/133377; G02F 1/1343; G02F 1/13394; G02F 1/1368; G02F 1/1339; G02F 1/13345; G02F 1/1341; H01L 27/124; H01L 27/1259
See application file for complete search history.

(56) References Cited

U.S. PATENT DOCUMENTS

| | | | | |
|---|---|---|---|---|
| 9,001,284 B2* | 4/2015 | Bae | ................... | G02F 1/134309 |
| | | | | 349/38 |
| 9,140,944 B2* | 9/2015 | Cho | ................... | G02F 1/133377 |
| 9,151,976 B2* | 10/2015 | Yang | ................ | G02F 1/133377 |
| 9,171,933 B2* | 10/2015 | Lee | ................... | H01L 29/66742 |
| 9,235,074 B2* | 1/2016 | Park | ................... | G02F 1/133305 |
| 9,244,301 B2* | 1/2016 | Hong | ................ | G02F 1/133377 |
| 9,291,841 B2* | 3/2016 | Bae | ...................... | H01L 27/1248 |
| 2014/0125908 A1* | 5/2014 | Hong | ................... | G02F 1/1333 |
| | | | | 349/44 |
| 2014/0267966 A1* | 9/2014 | Won | .................. | G02F 1/133377 |
| | | | | 349/42 |
| 2015/0092130 A1* | 4/2015 | Lee | ....................... | G02F 1/1341 |
| | | | | 349/43 |
| 2015/0212351 A1* | 7/2015 | Han | .................. | G02F 1/133377 |
| | | | | 349/41 |
| 2015/0234227 A1* | 8/2015 | Hong | ................ | G02F 1/133345 |
| | | | | 349/46 |
| 2015/0234228 A1* | 8/2015 | Byun | ................ | G02F 1/133377 |
| | | | | 349/43 |

(Continued)

FOREIGN PATENT DOCUMENTS

| | | |
|---|---|---|
| KR | 10-2011-0070475 | 6/2011 |
| KR | 10-2012-0026880 | 3/2012 |

*Primary Examiner* — Savitr Mulpuri
(74) *Attorney, Agent, or Firm* — Innovation Counsel LLP

(57) ABSTRACT

Provided is a display device that includes: a substrate on which a gate line, a data line, and a thin film transistor are positioned; an insulating layer positioned on the thin film transistor; a pixel electrode positioned on the insulating layer and connected to the thin film transistor; a roof layer that overlaps the substrate; a common electrode that includes a first portion and a second portion; a liquid crystal layer positioned in a microcavity that overlaps with the pixel electrode; and a separating member that is positioned on the insulating layer and overlaps the data line lengthwise. The first portion of the common electrode is positioned between the microcavity and the roof layer, and the second portion of the common electrode is positioned between the separating member and the roof layer.

8 Claims, 17 Drawing Sheets

(56) References Cited

U.S. PATENT DOCUMENTS

| | | | |
|---|---|---|---|
| 2015/0241743 A1* | 8/2015 | Jung | G02F 1/134336 349/43 |
| 2015/0268502 A1* | 9/2015 | Sung | G02F 1/13394 349/123 |
| 2015/0301397 A1* | 10/2015 | Lee | G02F 1/133377 349/86 |

* cited by examiner

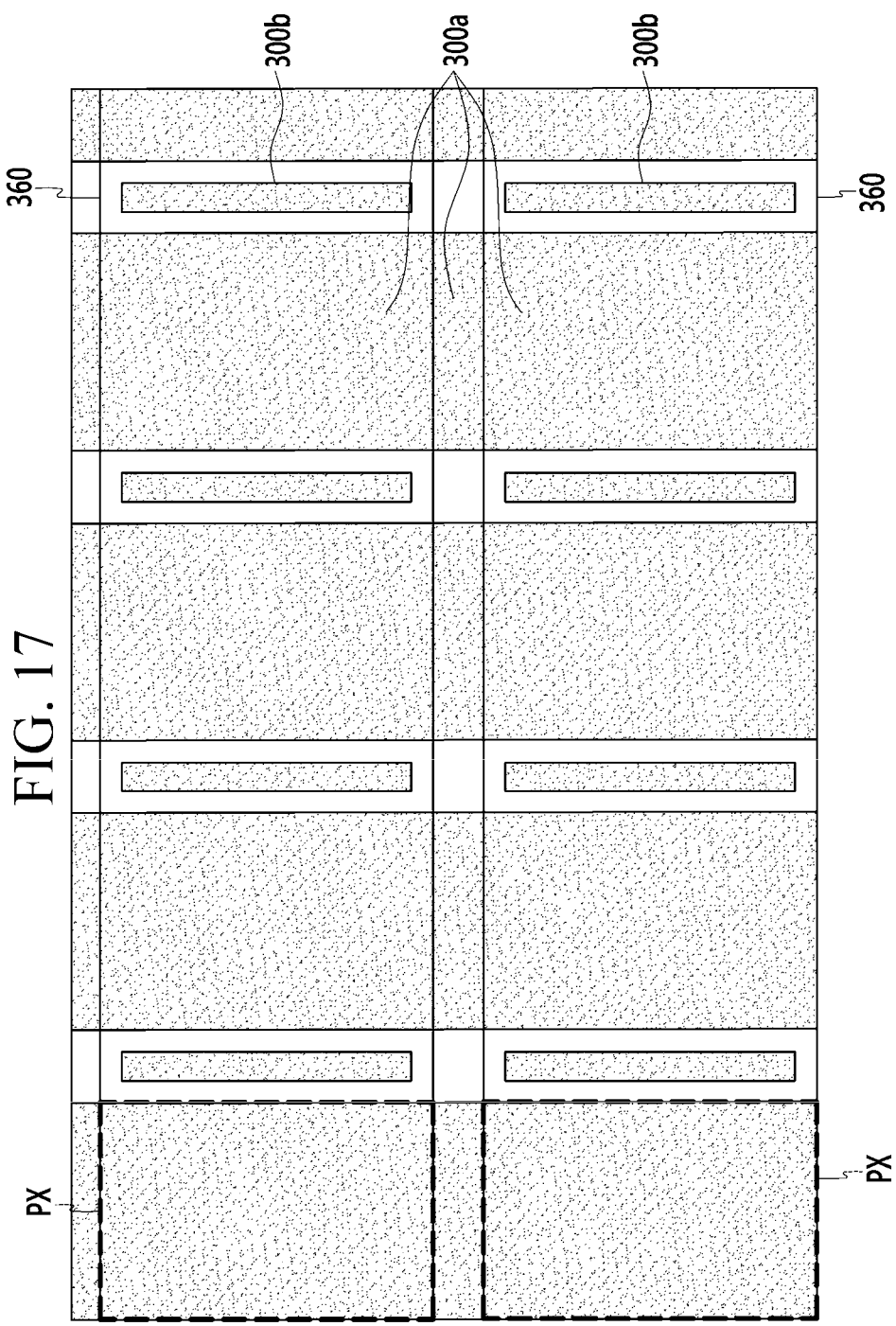

DISPLAY DEVICE AND MANUFACTURING METHOD THEREOF

CROSS-REFERENCE TO RELATED APPLICATION

This application claims priority to and the benefit of Korean Patent Application No. 10-2014-0046961 filed in the Korean Intellectual Property Office on Apr. 18, 2014, the entire contents of which are incorporated herein by reference.

BACKGROUND (a) Technical Field

The present system relate to a display device and a manufacturing method thereof.

(b) Description of the Related Art

A liquid crystal display (LCD) is one of the most common types of flat panel displays currently in use. The liquid crystal display generates an electric field by applying different potentials to a pixel electrode and a common electrode of a liquid crystal display panel in which a liquid crystal layer is formed between a lower panel and an upper panel. The electric field changes the arrangement and/or orientation of the liquid crystal molecules of the liquid crystal layer in varying degrees depending on the strength of the electric field. The ability to rearrange and/or twist the liquid crystal molecules allows the liquid crystal display to control the polarization of incident light, and thus, the transmittance of the liquid crystal molecules, to display an image.

The lower panel of a liquid crystal display panel generally includes an array of thin film transistors and faces the upper panel. In the lower panel, a gate line for transmitting a gate signal, a data line for transferring a data signal, a thin film transistor connected to the gate line and the data line, a pixel electrode connected to the thin film transistor, and the like are formed. In the upper panel, a light blocking member, a color filter, and a common electrode.

Traditionally, a liquid crystal display uses two sheets of substrates for the lower panel and the upper panel and a process of forming and bonding the aforementioned constituent elements onto each substrate. As a result, such a liquid crystal display panel is not only heavy and thick, but requires increased costs, processing time, and the like to manufacture.

There exists a technique for manufacturing a display device that involves forming a plurality of microcavities that which are tunnel-shaped structures on one substrate and injecting a liquid crystal into the microcavities. Such a display device has a portion in which the liquid crystal layer does not exist between a data line and a common electrode. As a result, a distance between the data line and the common electrode is decreased, but a capacitance Cdc value between the data line and the common electrode is increased, which causes an RC delay when the panel is driven.

SUMMARY

The present system and method provides a structure, and a display device having such a structure, that reduces an RC delay in a display device manufactured by using one substrate, and a manufacturing method thereof.

An exemplary embodiment of the present system and method provides a display device that includes: a substrate on which a gate line, a data line, and a thin film transistor are positioned; an insulating layer positioned on the thin film transistor; a pixel electrode positioned on the insulating layer and connected to the thin film transistor; a roof layer that overlaps with the substrate; a common electrode that includes a first portion and a second portion; a liquid crystal layer positioned in a microcavity that overlaps with the pixel electrode; and a separating member that is positioned on the insulating layer and overlaps the data line lengthwise, wherein the first portion of the common electrode is positioned between the microcavity and the roof layer, and the second portion of the common electrode is positioned between the separating member and the roof layer.

The separating member may be positioned such that a lower surface contacts the insulation layer and an upper surface contacts the second portion of the common electrode.

The second portion of the common electrode may contact a side surface of the separating member.

The upper surface and the side surfaces of the separating member may be substantially covered by the roof layer.

A height of the separating member may be the same as or smaller than a height of the microcavity.

A width of the separating member may be the same as or larger than a width of the data line that overlaps the separating member.

The common electrode may include a third portion that contacts the insulating layer in a region between the microcavity and the separating member.

The display device may further include a lower insulating layer positioned between the common electrode and the roof layer.

Another exemplary embodiment of the present system and method provides a method of manufacturing a display device. The method includes: forming a gate line, a data line, and a thin film transistor on a substrate; forming an insulating layer on the thin film transistor; forming a pixel electrode on the insulating layer, the pixel electrode is connected to the thin film transistor; forming a sacrificial layer that includes a sacrificial portion and a separating member; forming a common electrode on the sacrificial portion and the separating member; forming a roof layer on the common electrode; forming a microcavity that includes an injection hole by removing the sacrificial portion; and forming a liquid crystal layer in the microcavity by injecting a liquid crystal material through the injection hole.

The sacrificial portion may overlap with the pixel electrode, and the separating member may overlap with the data line in a direction in which the data line extends.

The common electrode may include a first portion positioned on the sacrificial portion and a second portion positioned on the separating member, and the second portion may contact an upper surface of the separating member.

The second portion of the common electrode may contact a side surface of the separating member.

The upper surface and the side surfaces of the separating member may be substantially covered by the roof layer during the forming of the microcavity.

The separating member may have the same height as or a smaller height than a height of the sacrificial portion.

The separating member may have the same width as or a larger width than a width of the data line that overlaps with the separating member.

The common electrode may include a third portion that contacts the insulating layer in a region between the sacrificial portion and the separating member.

The method may further include forming a lower insulating layer before the forming of the roof layer and after the forming of the common electrode.

BRIEF DESCRIPTION OF THE DRAWINGS

FIG. 17 is a diagram that illustrates a relationship between a sacrificial layer and a roof layer in a process for manufacturing a display device according to an exemplary embodiment of the present system and method.

DETAILED DESCRIPTION OF THE EMBODIMENTS

Figure 1:
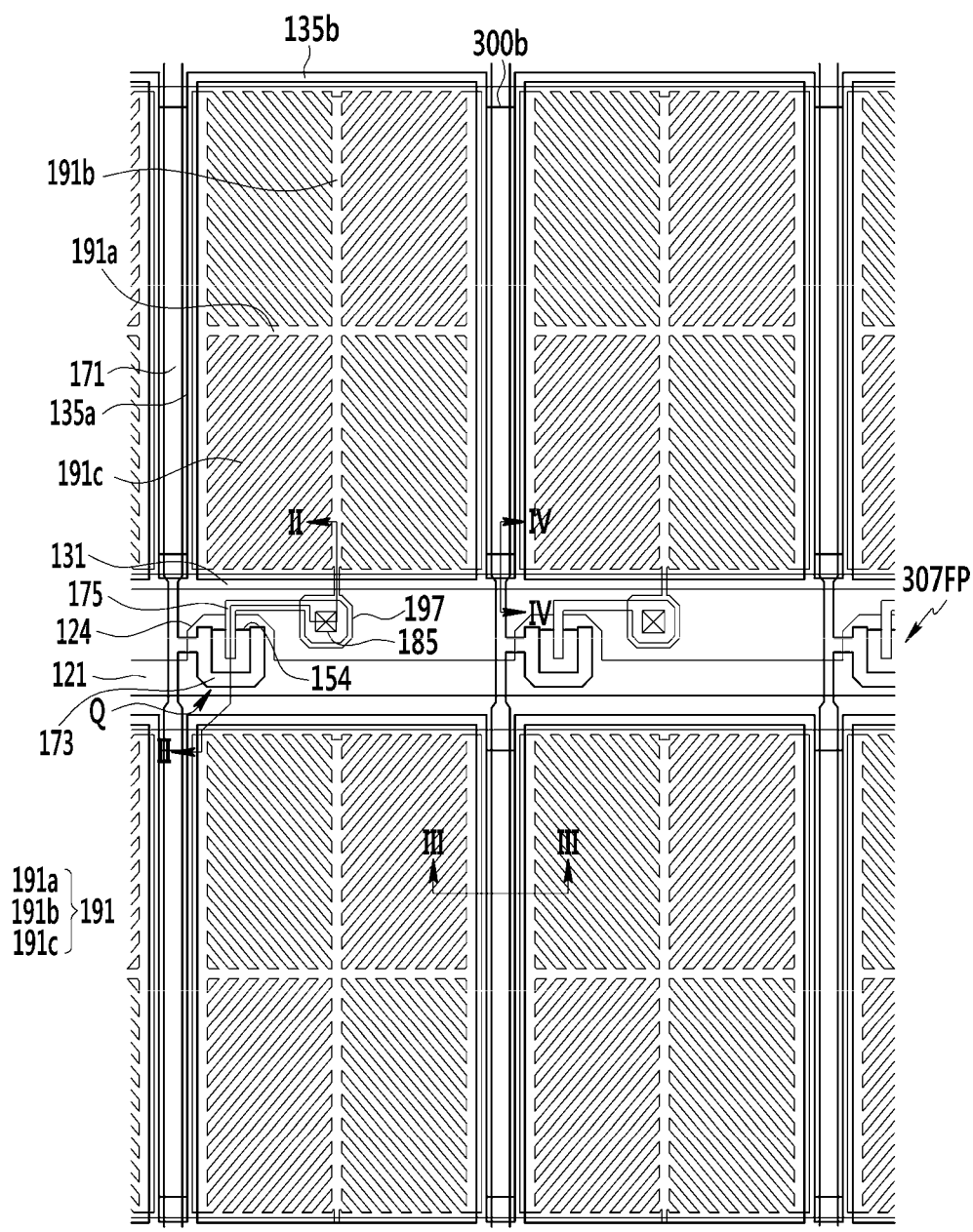
FIG. 1 is a plan view that illustrates a display device according to an exemplary embodiment of the present system and method.

The present system and method are described hereinafter with reference to the accompanying drawings in which exemplary embodiments are shown. Those of ordinary skill in the art would realize that the described embodiments may be modified in various different ways, all without departing from the spirit or scope of the present system and method.

In the drawings, the thickness of layers, films, panels, regions, etc., are exaggerated for clarity and may not be drawn to scale. Like reference numerals designate like elements throughout the specification. It is understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a display device according to an exemplary embodiment of the present system and method is described with reference to the accompanying drawings.

Figure 2:
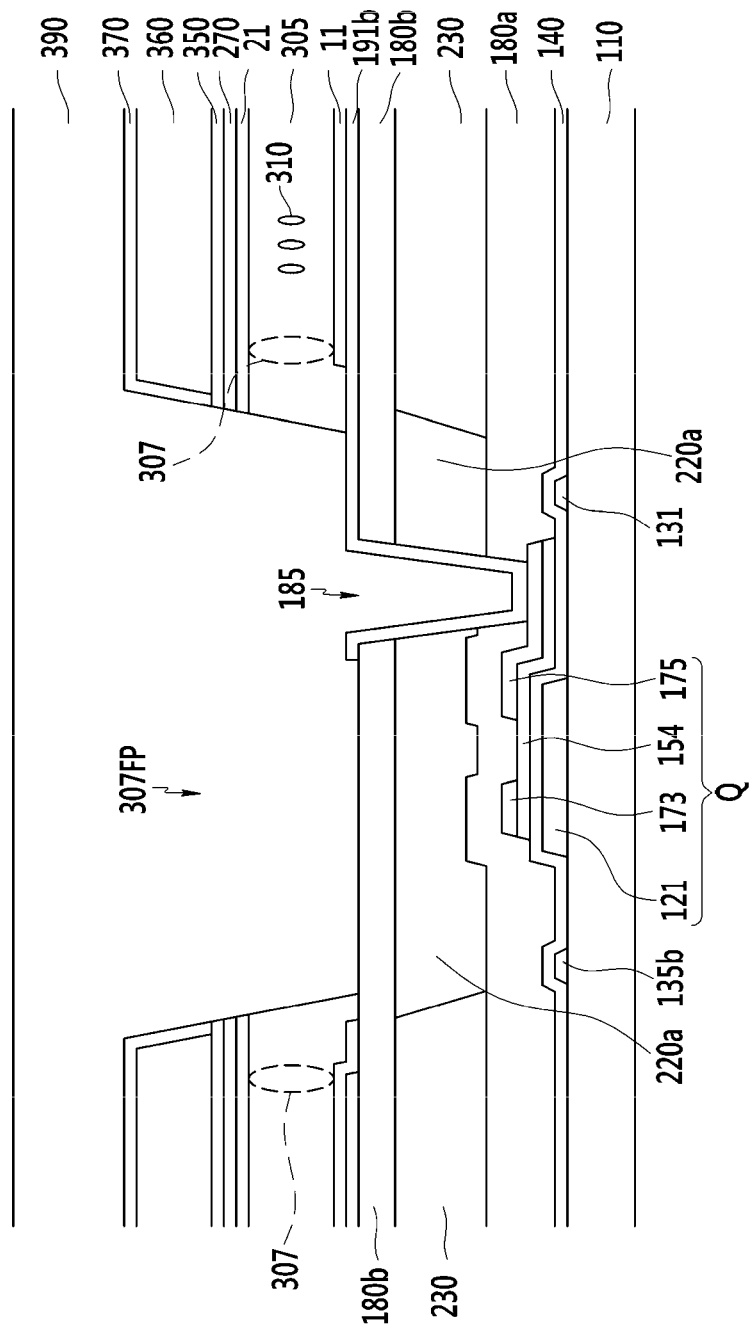
FIG. 2 illustrates an example of a cross section taken along line II-II of FIG. 1.
Figure 3:
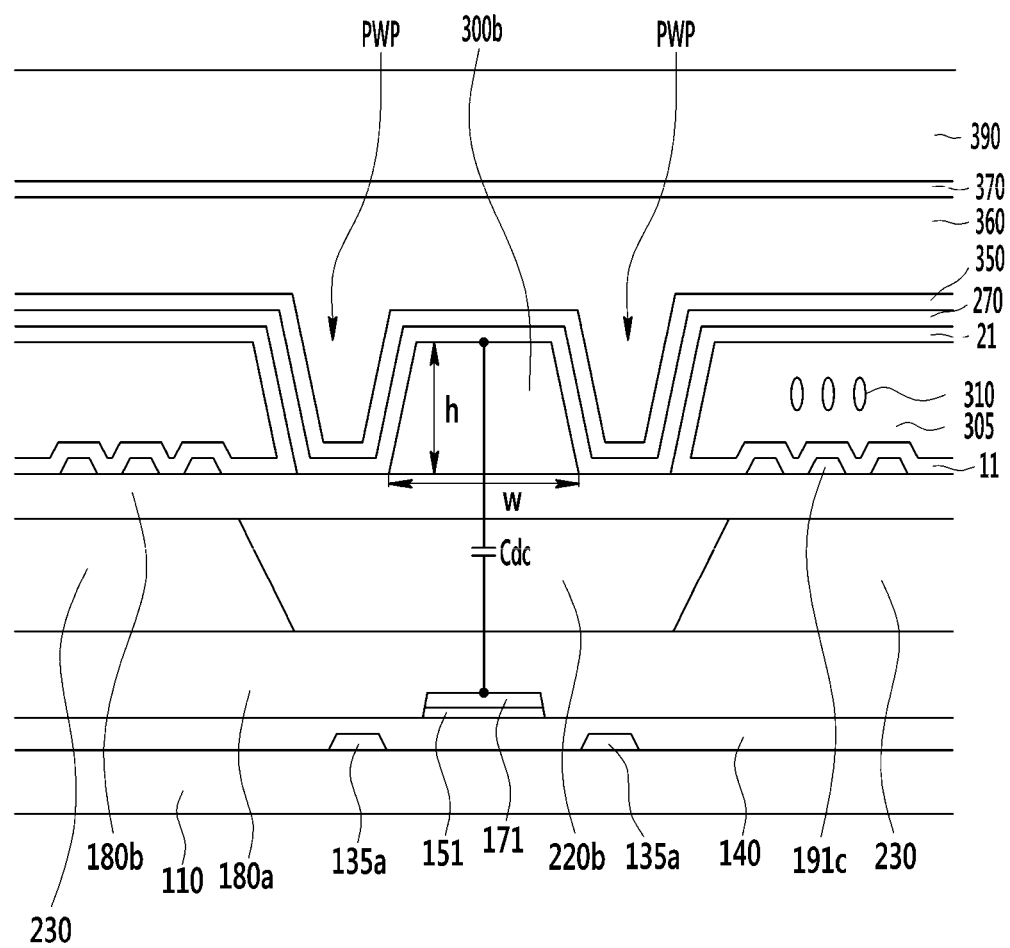
FIG. 3 illustrates an example of a cross section taken along line III-III of FIG. 1.
Figure 4:
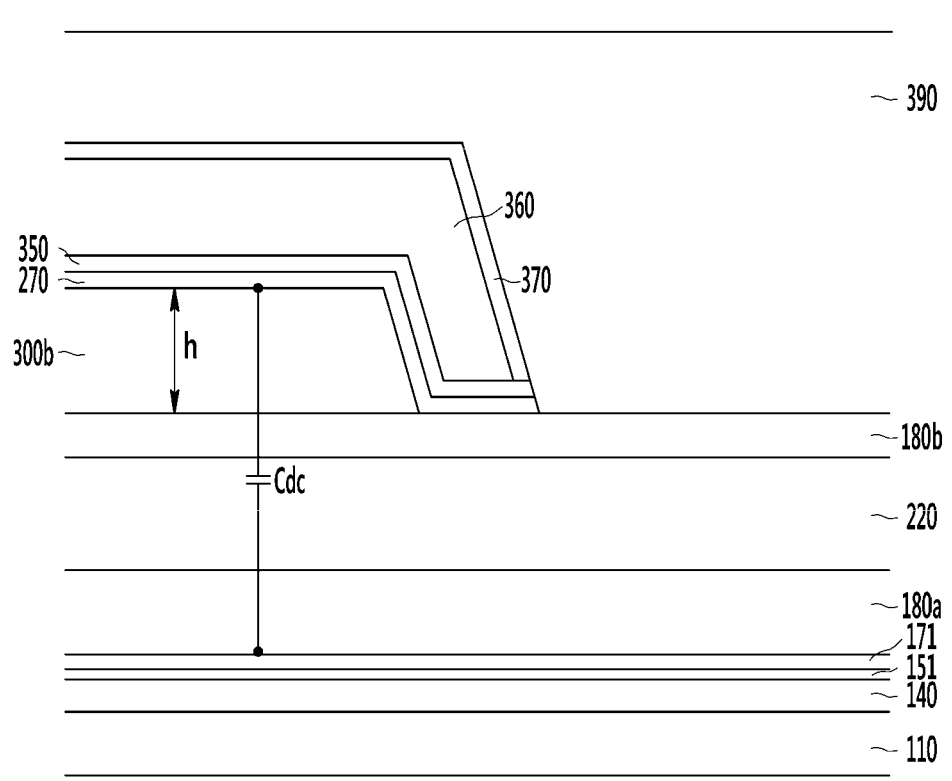
FIG. 4 illustrates an example of a cross section taken along line IV-IV of FIG. 1.

FIG. 1 is a plan view that illustrates a display device according to an exemplary embodiment of the present system and method. FIG. 1 illustrates four adjacent pixel areas. The plurality of pixel areas is disposed in a matrix form that includes a plurality of pixel rows and a plurality of pixel columns. FIG. 2 illustrates an example of a cross section taken along line II-II of FIG. 1. FIG. 3 illustrates an example of a cross section taken along line III-III of FIG. 1. FIG. 4 illustrates an example of a cross section taken along line IV-IV of FIG. 1.

Referring to FIGS. 1 to 4, a gate conductor that includes a gate line 121 and a storage electrode line 131 is formed on a substrate 110 made of a transparent insulator such as glass or plastic. The gate line 121 extends in a first (e.g., horizontal) direction and transmits a gate signal. The gate line 121 includes a gate electrode 124 that protrudes from the gate line 121. The shape of the gate electrode 124 may vary.

The storage electrode line 131 extends in the first (e.g., horizontal) direction and transmits a predetermined voltage such as a common voltage Vcom. The storage electrode line 131 includes a pair of vertical portions 135a that extend in a second direction substantially perpendicular (e.g., vertical) to the first direction in which the gate line 121 extends, and a horizontal portion 135b that connects the extended ends of the pair of vertical portions 135a. The vertical portions 135a and the horizontal portion 135b of the storage electrode line 131 may substantially surround a pixel electrode 191.

A gate insulating layer 140 is formed on the gate line 121 and the storage electrode line 131. The gate insulating layer 140 may be made of an inorganic insulating material such as silicon nitride (SiNx) and silicon oxide (SiOx). The gate insulating layer 140 may be formed as a single layer or as multilayers.

A semiconductor 151 is formed on the gate insulating layer 140 beneath a data line 171. A semiconductor 154 is also formed on the gate insulating layer 140 beneath a source electrode 173, a drain electrode 175, and a channel portion of a thin film transistor Q. The semiconductors 151 and 154 may be made of amorphous silicon, polycrystalline silicon, metal oxide, and the like.

An ohmic contact (not illustrated) may be formed among the semiconductors 151 and 154, the data line 171, and the source/drain electrodes. The ohmic contact may be made of silicide or a material such as n+ hydrogenated amorphous silicon in which n-type impurity is doped at a high concentration.

A data conductor that includes the source electrode 173, the drain electrode 175, and a data line 171 connected to the source electrode 173 is formed on the semiconductors 151 and 154 and the gate insulating layer 140. The data line 171 transmits a data signal and extends in the vertical direction and crosses the gate line 121. The source electrode 173, the drain electrode 175, the gate electrode 124 and the semiconductor 154 together form the thin film transistor Q such that the channel of the thin film transistor Q is formed in the semiconductor 154 between the source electrode 173 and the drain electrode 175.

A first insulating layer 180a is formed on the data conductor (e.g., 171, 173, and 175) and an exposed portion of the semiconductor 154. The first insulating layer 180a may include an inorganic insulator, such as silicon nitride (SiOx) and silicon oxide (SiOx), or an organic insulator.

A color filter 230 and a light blocking member 220 are formed on the first insulating layer 180a. The light blocking member 220 is formed in a lattice structure that has openings that correspond to an area for displaying the image and is made of a material that does not transmit light. The light blocking member 220 includes a horizontal light blocking member 220a that is formed in a direction parallel to the horizontal direction in which the gate line 121 extends, and a vertical light blocking member 220b that is formed in a direction parallel to the vertical direction in which the data line 171 extends. According to an exemplary embodiment, the light blocking member 220 may be formed on an upper insulating layer 370, which is described below.

The color filter 230 may transmit color light that corresponds to one of the three primary colors: red, green and blue, but is not limited thereto. For example, the color filter 230 may transmit color light that corresponds to one of cyan, magenta, yellow, and white-based colors. The color filter 230 may be made of a material such that different colors of light are transmitted for adjacent pixels.

A second insulating layer 180b is formed on and covers the color filter 230 and the light blocking member 220. The second insulating layer 180b may include an inorganic insulator such as silicon nitride (SiNx) and silicon oxide (SiOx) or an organic insulator. When a step is generated due to a thickness difference between the color filter 230 and the light blocking member 220, the second insulating layer 180b may include an organic insulator to reduce or remove the step.

A contact hole 185 that exposes the drain electrode 175 is formed in the light blocking member 220 and the insulating layers 180a and 180b. A pixel electrode 191 is formed on the second insulating layer 180b. The pixel electrode 191 may be made of a transparent conductive material such indium tin oxide (ITO) and indium zinc oxide (IZO).

An overall shape of the pixel electrode 191 may be a quadrangle. The pixel electrode 191 includes a horizontal stem 191a and a vertical stem 191b that crosses the horizontal stem 191a. The pixel electrode 191 is divided into four subregions by the horizontal stem 191a and the vertical stem 191b, and each subregion includes a plurality of smaller branches 191c. In the exemplary embodiment shown in FIG. 1, the pixel electrode 191 may further include an outer stem that surrounds an overall shape of the pixel electrode 191.

The smaller branches 191c of the pixel electrode 191 may form an angle (e.g., approximately 40° to 45°) with the gate line 121 or the horizontal stem. The smaller branches of two adjacent subregions may be orthogonal to each other. A width of the smaller branches may gradually increase, or a distance between the smaller branches 191c may vary.

The pixel electrode 191 includes an extension 197 that is connected to a lower (orientation as shown in FIG. 1) end of the vertical stem 191b. The extension 197 has a larger area and/or is wider than the vertical stem 191b and overlaps with the contact hole 185. The pixel electrode 191 is physically and electrically connected to the drain electrode 175 via the extension 197 through the contact hole 185, and receives a data voltage from the drain electrode 175.

The foregoing description of the thin film transistor Q and the pixel electrode 191 is just an example. The structure of the thin film transistor and the design of the pixel electrode may be modified such as to improve side visibility.

A lower alignment layer 11 is formed on the pixel electrode 191. An upper alignment layer 21 is formed below a common electrode 270 and faces the lower alignment layer 11.

The lower alignment layer 11 and the upper alignment layer 21 may be vertical alignment layers. The alignment layers 11 and 12 may include at least one of polyamic acid, polysiloxane, and polyimide.

A microcavity 305 is formed between the lower alignment layer 11 and the upper alignment layer 21. The microcavity 305 may be formed in one or more pixel areas (e.g., formed over two adjacent pixel areas). A liquid crystal material that includes liquid crystal molecules 310 is injected into the microcavity 305 to form a liquid crystal layer. The microcavity 305 may be formed in a column-wise direction (orientation as shown in FIG. 1), that is, in a vertical direction in which the data line 171 extends. The alignment material that forms the alignment layers 11 and 21, and the liquid crystal material may be injected into the microcavity 305 through an injection hole 307 by using capillary force.

The microcavity 305 is divided in a vertical direction (as shown in FIG. 1) by a plurality of injection hole formation portions 307FP that overlap with the gate lines 121. Further, a plurality of microcavities 305 is formed in an extending direction of the gate line 121. Each microcavity 305 may correspond to one or more pixel areas.

The common electrode 270 and a lower insulating layer 350 are positioned on the upper alignment layer 21. The common electrode 270 receives a common voltage and generates an electric field together with the pixel electrode 191, to which the data voltage is applied, to affect the tilt directions of the liquid crystal molecules 310 positioned in the microcavity 305 between the two electrodes. The common electrode 270 forms a capacitor together with the pixel electrode 191 to maintain the applied voltage even after the thin film transistor is turned off. The lower insulating layer 350 may be formed of silicon nitride (SiNx) or silicon oxide (SiOx).

The common electrode 270 and the lower insulating layer 350 are formed such that they overlap with the data line 171. Accordingly, the data line 171, the common electrode 270, and the insulator between the data line 171 and the common electrode 270 form a capacitor with a capacitance Cdc. That is, the data line 171 and the common electrode 270 form the two electrodes of the capacitor. The data line 171 and the common electrode 270 may be substantially parallel to each other.

According to the exemplary embodiment shown in FIG. 3, the common electrode 270 is formed on a separating member 300b that is positioned on the second insulating layer 180b and that overlaps with the data line 171. By forming the common electrode 270 on top of the separating member 300b, the common electrode 270 is further separated from the data line 171 by a height h of the separating member 300b. Because the capacitance Cdc is inversely proportional to the distance between the electrodes (i.e., the data line 171 and the common electrode 270), when the distance between the data line 171 and the common electrode 270 increases, the capacitance Cdc decreases. Accordingly, any RC delay associated with the capacitance Cdc, distortion of signals due to the RC delay, errors of a gray voltage, and the like may be reduced, thereby improving display quality. The separating member 300b may be a part of a sacrificial layer 300 that is described below.

Although portions of the common electrode 270 that overlap the data line 171 are mostly formed on the separating member 300b, overlapping portions in the regions between the pixel areas that are separated by the gate line 121 may be positioned directly on the second insulating layer 180b, as FIG. 4 illustrates. The overlapping portions in these regions generally do not influence the capacitance between the common electrode 270 and the data line 171 to a significant degree because the surface area of these regions is very small and the capacitance is proportional to the area of the electrode. According to an exemplary embodiment, the portions of the common electrode 270 that are positioned directly on the second insulating layer 180b may be removed.

A roof layer 360 is positioned on the lower insulating layer 350. The roof layer 360 serves to support the microcavity 305, which includes a space between the pixel electrode 191 and the common electrode 270. The roof layer 360 may include a photoresist or other organic materials. The roof layer 360 may cover the entire separating member 300b. That is, the roof layer 360 may cover an upper surface and all the sides of the separating member 300b. The roof layer 360 may directly cover the separating member 300b, or one or more layers, such as the common electrode 270 layer, may exist between the separating member 300b and the roof layer 360. According to an embodiment, a vertical length of the separating member 300b (orientation as shown in FIG. 1) is smaller than a vertical length of the roof layer 360, and in a plan view, the separating member 300b is fully included in the roof layer 360.

The upper insulating layer 370 is positioned on the roof layer 360 and may contact an upper surface of the roof layer 360. The upper insulating layer 370 may be made of an inorganic insulating material such as silicon nitride (SiNx) and silicon oxide (SiOx). A function of the upper insulating layer 370 is to protect the roof layer 360 that is made of an organic material. The upper insulating layer 370, however, may be omitted.

A capping layer 390 covers the injection hole 307 of the microcavity 305 exposed by the injection hole formation portion 307FP and fills the injection hole formation portion 307FP. Since the capping layer 390 contacts the liquid crystal molecules 310, the capping layer 390 may be made of a material that does not react with liquid crystal molecules 310, such as parylene.

The capping layer 390 may be formed as a multilayer such as a double layer and a triple layer. A double layer includes two layers that are made of different materials. A triple layer includes three layers in which materials of adjacent layers are different from each other. For example, the capping layer 390 may include a layer of an organic insulating material and a layer of an inorganic insulating material.

Although not illustrated, polarizers may be further formed on upper and lower surfaces of the display device. That is, the polarizers may include a first polarizer that is attached onto the lower surface of the substrate 110 and a second polarizer that is attached onto the upper surface of the capping layer 390.

In the exemplary embodiment illustrated in FIG. 3, a partition wall formation portion PWP is formed in the roof layer 360 between the microcavity 305 and the separating member 300b for microcavities 305 that are adjacent to each other in the horizontal direction. The partition wall formation portion PWP may be formed along the extending direction of the data line 171 in the roof layer 360. The lower insulating layer 350, the common electrode 270, the upper insulating layer 370, and the partition wall formation portion PWP form a partition wall structure that, together with the separating member 300b, partitions or defines the microcavity 305. The partition wall structure reduces the stress and change in a cell gap when the substrate 110 is bent.

Hereinafter, an exemplary process for manufacturing the display device described above is described with reference to FIGS. 5 to 17. The exemplary process described below may be modified by those of ordinary skill in the art without departing from the scope of the present system and method.

FIGS. 5 to 16 are process cross-sectional views that illustrate a manufacturing method for a display device according to another exemplary embodiment of the present system and method. FIG. 17 is a diagram that illustrates a relationship between a sacrificial layer and a roof layer in a process for manufacturing the display device according to an exemplary embodiment of the present system and method. FIGS. 5, 7, 9, 11, 12, 14, and 16 sequentially illustrate cross sections taken along line II-II of FIG. 1, and FIGS. 6, 8, 10, 13, and 15 sequentially illustrate cross sections taken along line III-III of FIG. 1.

Figure 5:
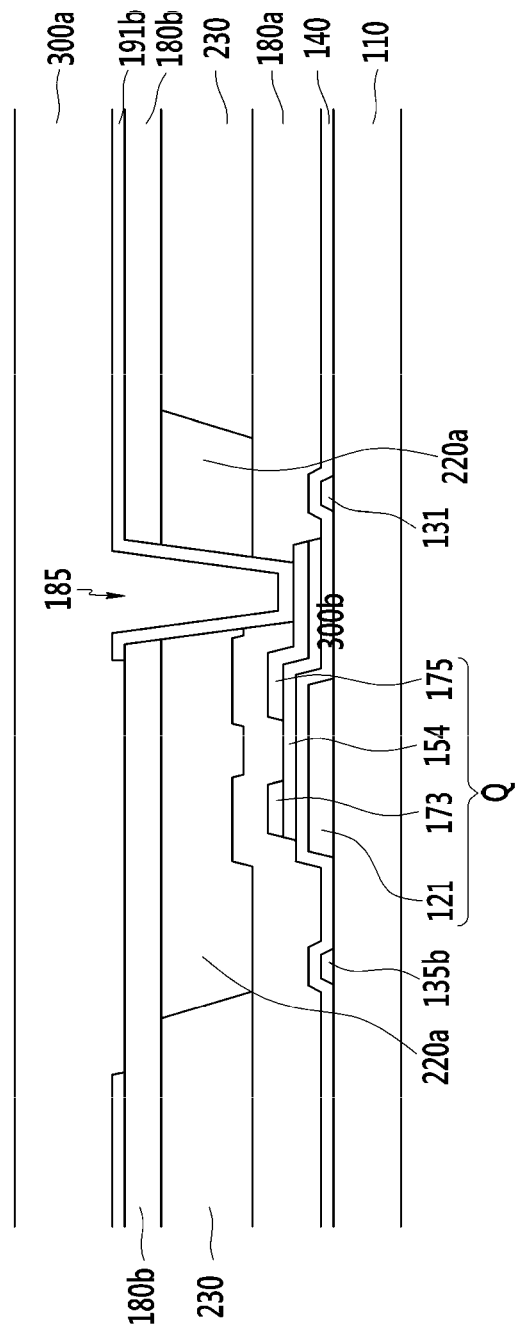
FIGS. 5 to 16 are process cross-sectional views that illustrate a manufacturing method of a display device according to another exemplary embodiment of the present system and method.
Figure 6:
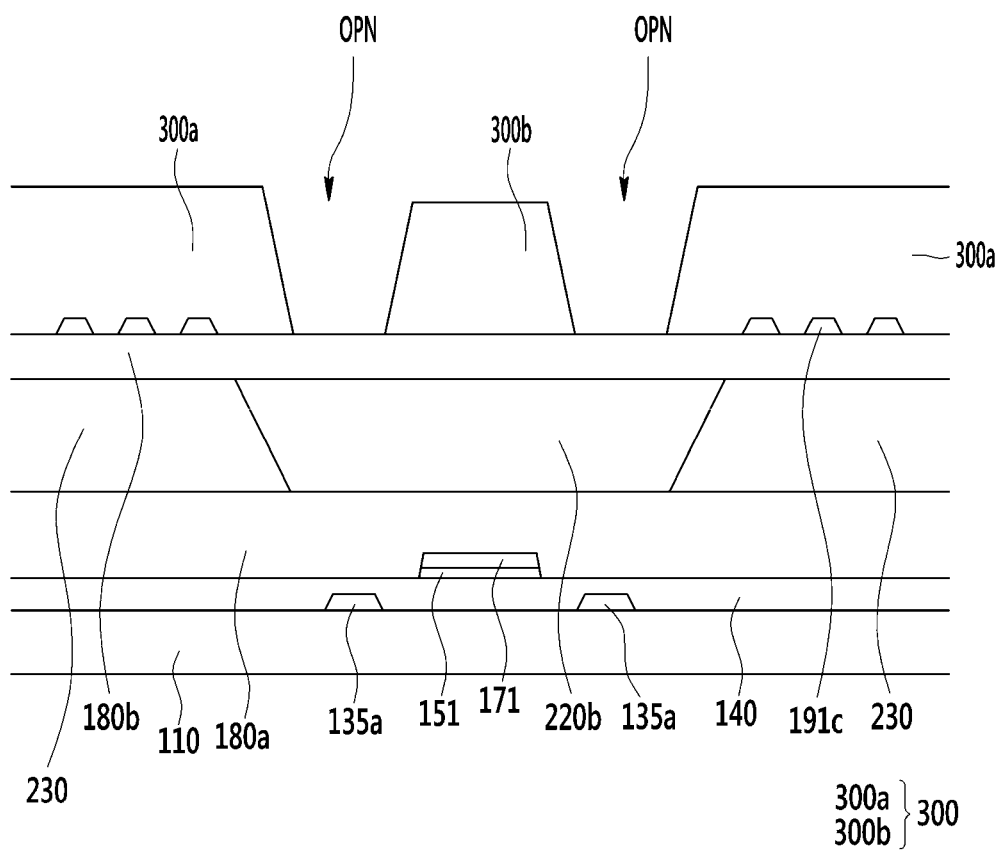

Referring to FIGS. 1, 5, and 6, the gate line 121, which extends in a first (e.g., horizontal) direction, and the gate insulating layer 140 on the gate line 121 are formed on the substrate 110 as part of a switching element. The semiconductors 151 and 154 are formed on the gate insulating layer 140, and the source electrode 173 and the drain electrode 175 are formed on the semiconductor 154. The data line 171, which is connected to the source electrode 173, may be formed to extend in a second (e.g., vertical) direction that crosses the gate line 121. When the gate line 121 is formed, the storage electrode line 131 may be formed together.

The first insulating layer 180a is formed on the data conductor, which includes the source electrode 173, the drain electrode 175, the data line 171, and the exposed portion of the semiconductor 154. On the first insulating layer 180a, the color filter 230 is formed at a position that corresponds to the pixel area, and the light blocking member 220 that covers the data conductor and the like is formed between adjacent color filters 230.

The second insulating layer 180b is formed on and covers the color filter 230 and the light blocking member 220. The contact hole 185, which electrically and physically connects the pixel electrode 191 and the drain electrode 175, is formed in the light blocking member 220 and the second insulating layer 180b.

Thereafter, the pixel electrode 191 is formed on the second insulating layer 180b, and the sacrificial layer 300 is formed on the pixel electrode 191. The pixel electrode 191 may be formed, for example, by depositing and then patterning a transparent conductive material such as indium tin oxide (ITO) and indium zinc oxide (IZO).

The sacrificial layer 300 includes a sacrificial portion 300a, which may be formed using a photolithography process that involves coating a photosensitive organic material on the pixel electrode 191. The sacrificial layer 300 also includes the separating member 300b. The sacrificial portion 300a is formed such that it overlaps with the pixel electrode 191, and the separating member 300b is formed such that it overlaps with the data line 171. The sacrificial portions 300a may be formed such that they are connected to each other in the vertical direction (orientation as shown in FIG. 1). The separating members 300b may be formed such that they are disconnected from each other in the region between adjacent pixel areas in the vertical direction. The sacrificial portion 300a is removed in a subsequent process to form the microcavity 305, but the separating member 300b is not removed and remains on the substrate. Since the sacrificial portion 300a and the separating member 300b are formed by patterning the same layer, their heights may be the same. However, in some cases, their heights may be different. For example, the height of the separating member 300b may be made lower than the sacrificial portion 300a.

Referring to FIG. 17, the separating member 300b is formed between the sacrificial portions 300a, and two ends along the length (the vertical direction in FIG. 17) of the separating member 300b are positioned within the roof layer 360 in a plan view. As illustrated in FIG. 6, an open portion OPN is formed in the sacrificial layer 300 between the sacrificial portion 300a and the separating member 300b and in a direction parallel to the data line 171. In a subsequent process, the common electrode 270, the lower insulating layer 350, the roof layer 360, and the upper insulating layer 370 fill the open portion OPN to form the partition wall structure.

Figure 7:
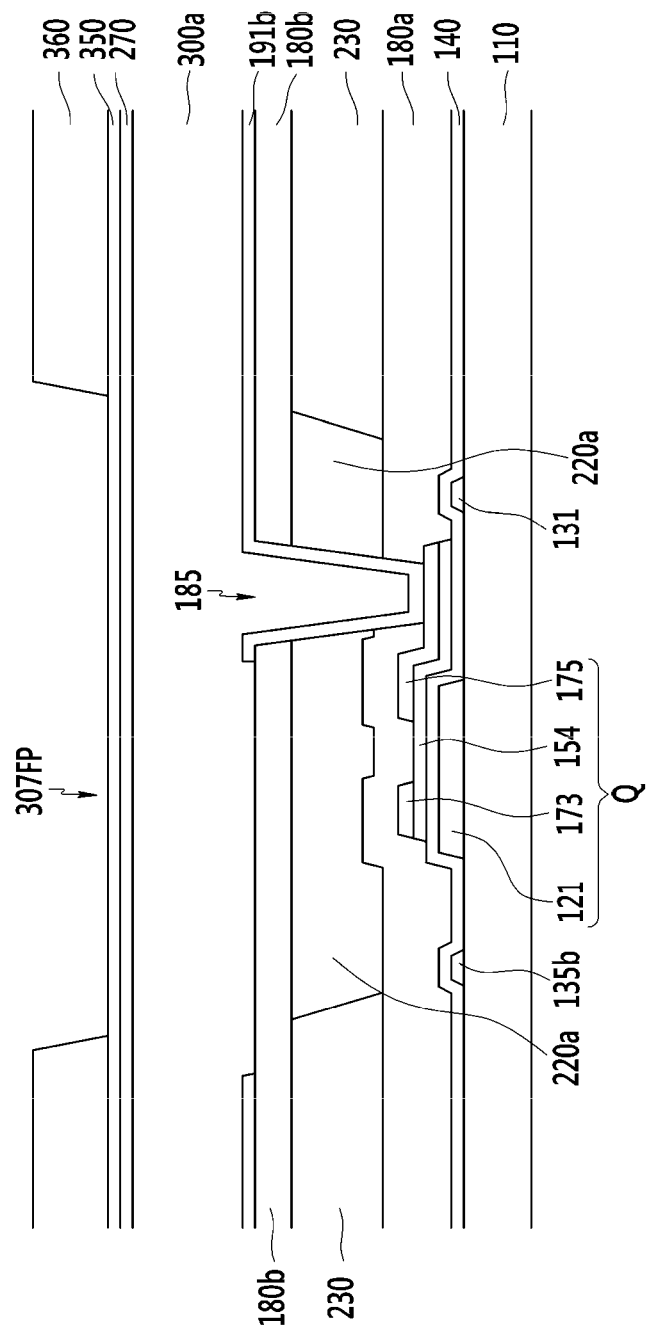
Figure 8:
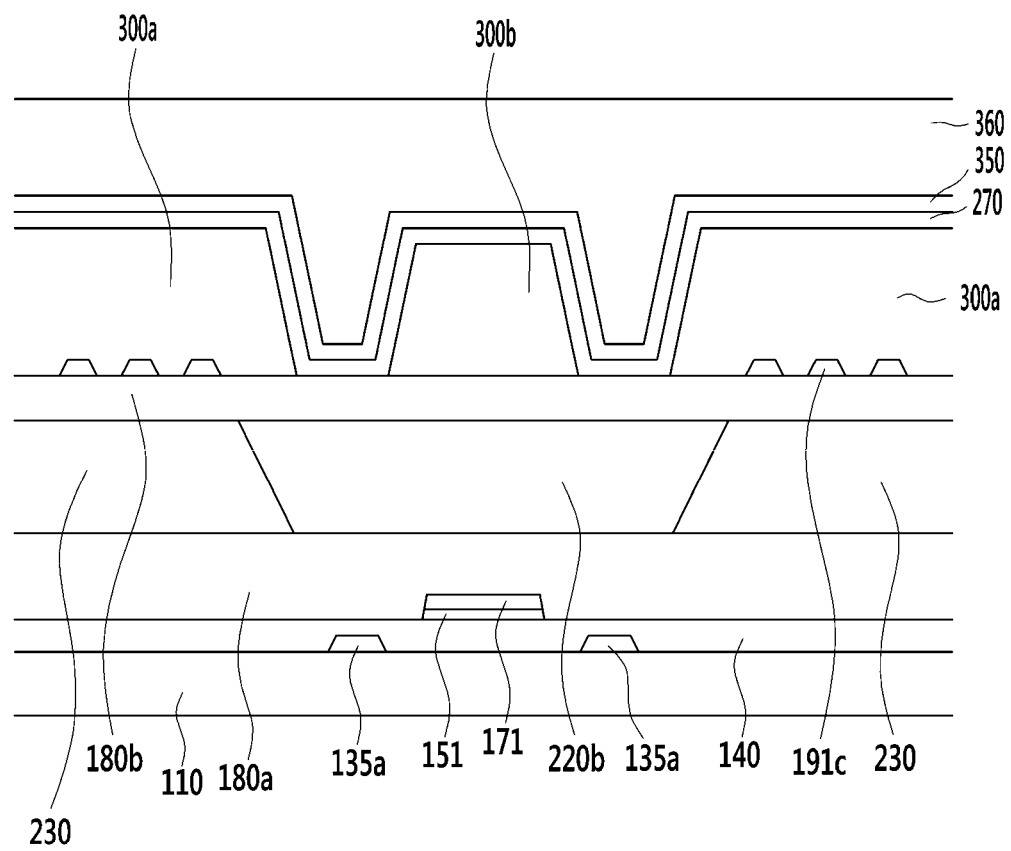

Referring to FIGS. 7 and 8, the common electrode 270, the lower insulating layer 350, and the roof layer 360 are sequentially formed on the sacrificial layer 300. The roof layer 360 may be removed from a region that corresponds to the horizontal light blocking member 220a positioned between the adjacent pixel areas in the vertical direction (orientation as shown in FIG. 1), such as through exposing and developing processes. Such a case is illustrated in FIG. 17, where a shaded portion corresponds to the sacrificial layer 300, and a rectangular portion that spans multiple pixel areas in the horizontal direction corresponds to the roof layer 360 (e.g., two such rectangular portions are shown in FIG. 17). Although not illustrated, the common electrode 270 and the lower insulating layer 350 may be formed on the entire surface of the substrate.

When the roof layer 360 is removed from the region that overlaps (in a plan view) with the horizontal light blocking member 220a, the roof layer 360 exposes the lower insulating layer 350 in the region to the outside. In this case, the common electrode 270, the lower insulating layer 350, and the roof layer 360 fill the open portion OPN that overlaps with the vertical light blocking member 220b to form the partition wall structure. The common electrode 270, the lower insulating layer 350, and the roof layer 360 are further formed to surround the upper surface and all the sides of the separating member 300b. Accordingly, the partition wall formation portion PWP of the roof layer 360 forms the partition wall structure together with the separating member 300b, the common electrode 270, and the lower insulating layer 350.

Figure 9:
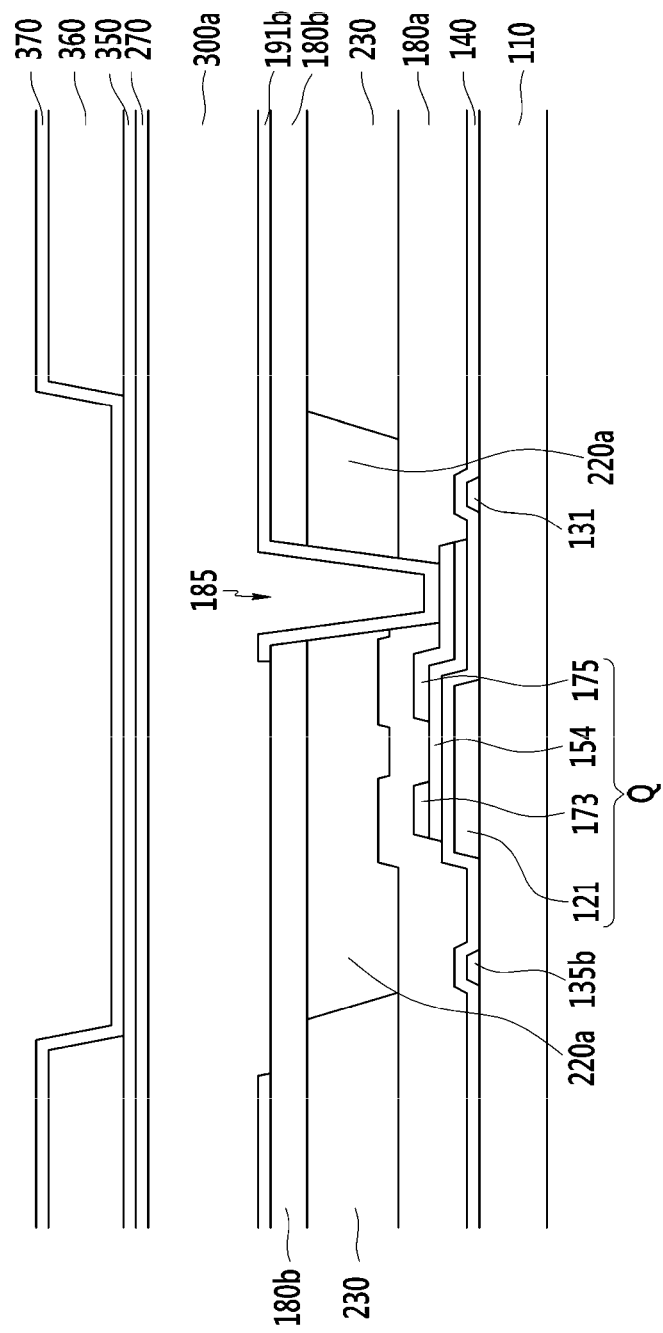
Figure 10:
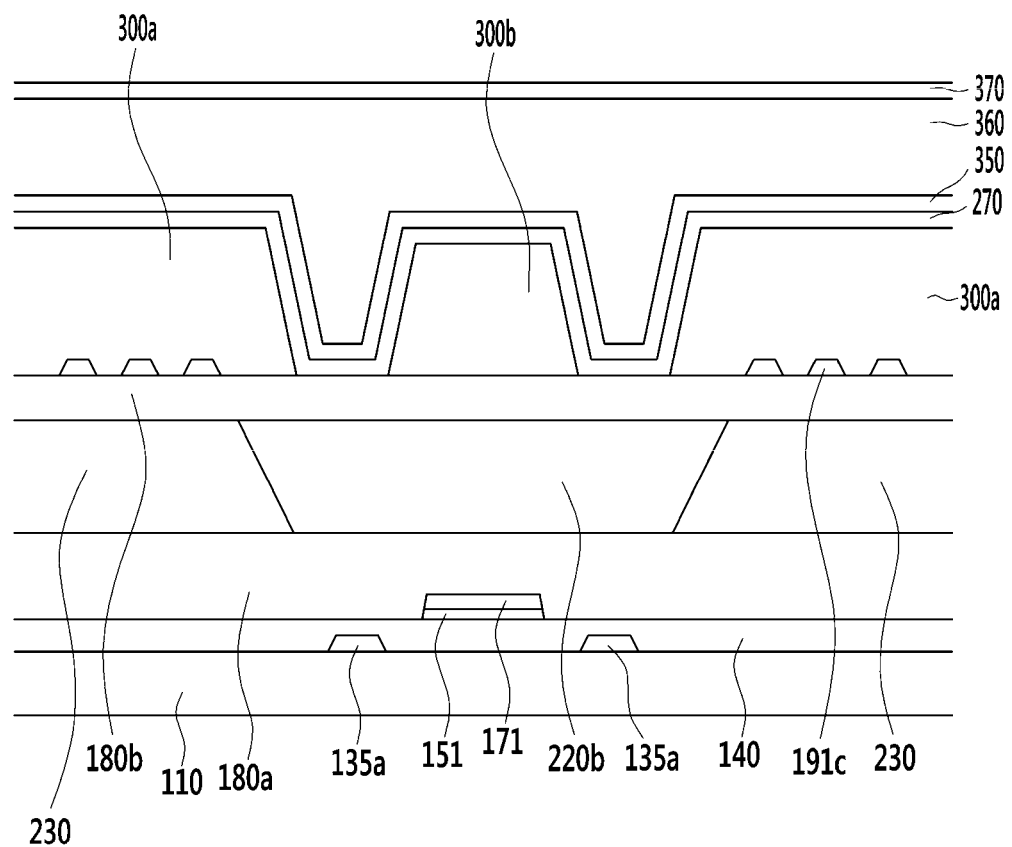

Referring to FIGS. 9 and 10, the upper insulating layer 370 is formed to cover the roof layer 360 and the exposed lower insulating layer 350.

Figure 11:
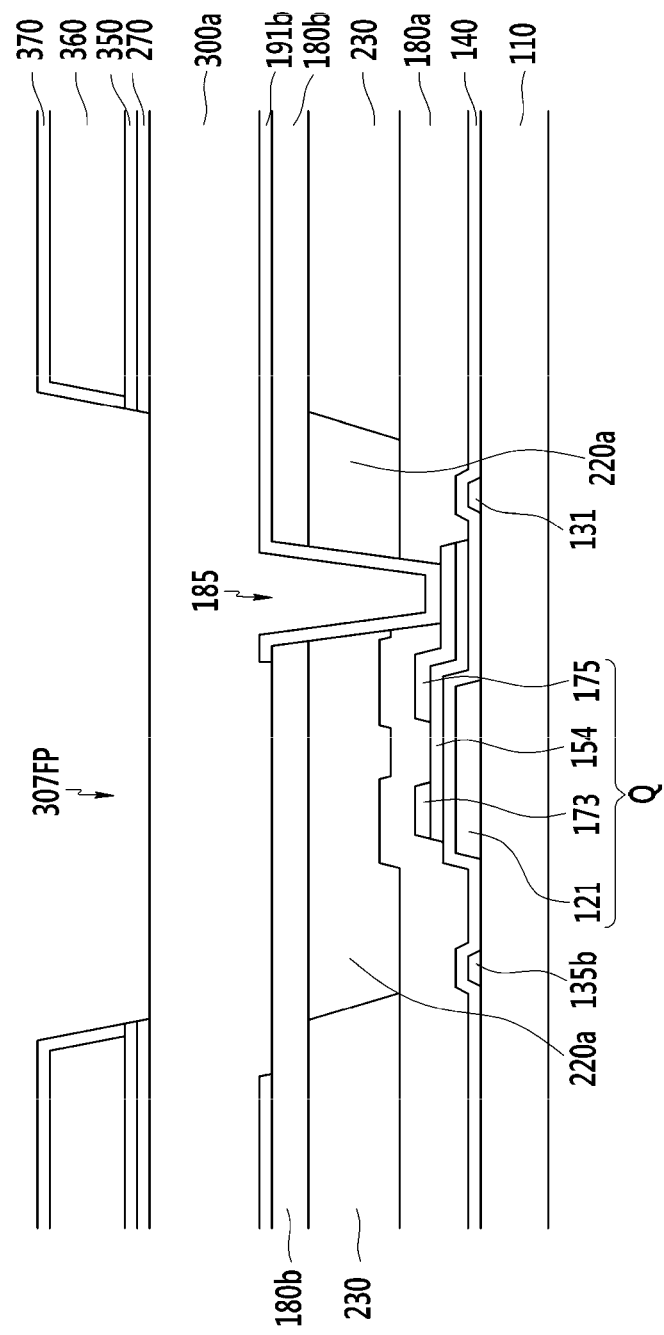

Referring to FIG. 11, the upper insulating layer 370, the lower insulating layer 350, and the common electrode 270 are partially removed, for example, by dry-etching to form the injection hole formation portion 307FP. Although FIG. 11 shows that the upper insulating layer 370 may cover a side surface of the roof layer 360, in another embodiment, the upper insulating layer 370 may not cover the side surface of the roof layer 360 and may expose the side surface of the roof layer 360 to the outside.

Figure 12:
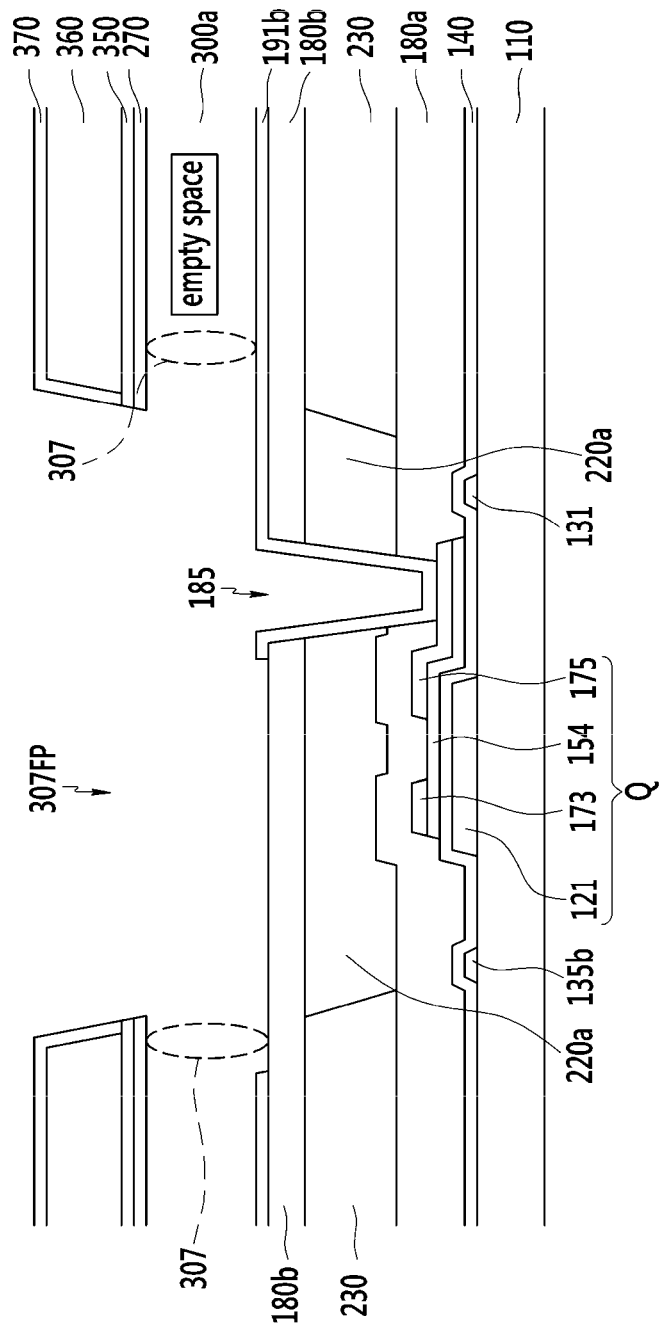
Figure 13:
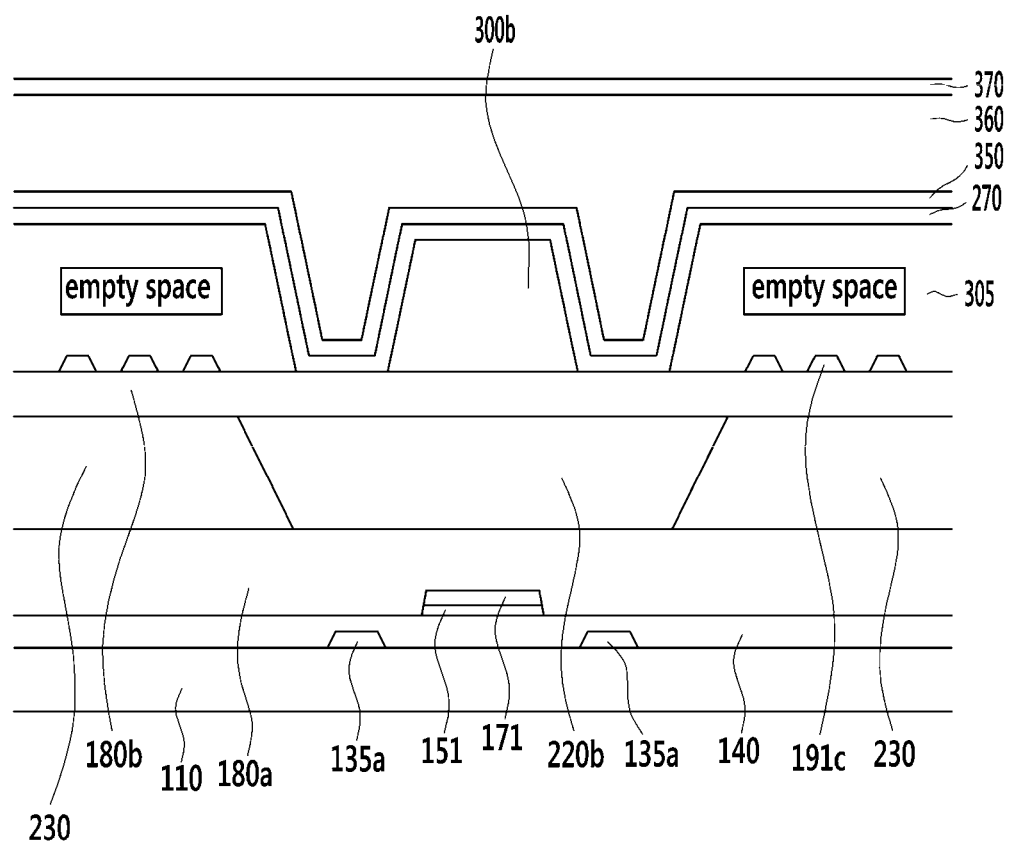

Referring to FIGS. 12 and 13, the sacrificial portion 300a may be removed by an oxygen ($O_2$) ashing process or a wet-etching method through the injection hole formation portion 307FP to form the microcavity 305, which includes the injection hole 307. The separating member 300b, however, is not removed and remains as it is because the separating member 300b is fully surrounded by the roof layer 360 and the like. The microcavity 305 is an empty space formed from where the sacrificial layer 300 is removed. To maintain the shape of the microcavity 305, the roof layer 360 may be cured by heating.

Figure 14:
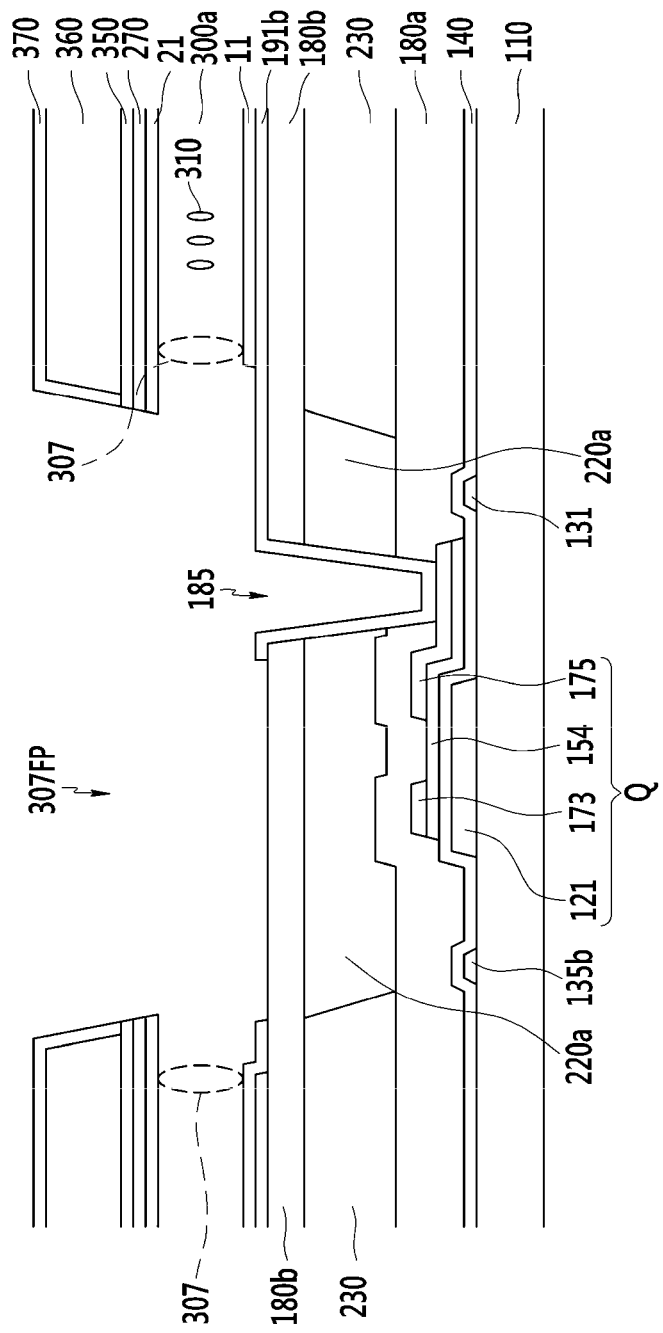
Figure 15:
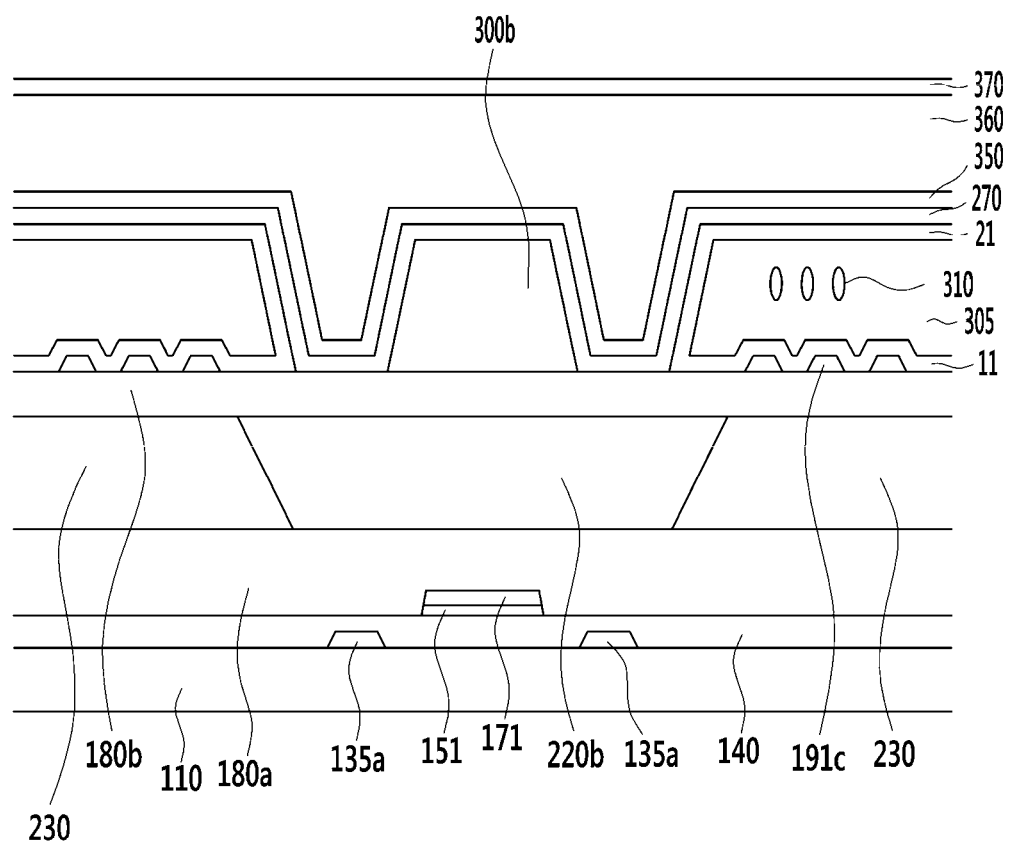

Referring to FIGS. 14 and 15, the alignment layers 11 and 21 are formed on the pixel electrode 191 and the common electrode 270, respectively, by injecting an aligning material through the injection hole 307. For example, when an aligning agent that contains the alignment material is dropped onto the substrate 110 by a spin coating method or an inkjet method, the aligning agent is injected into the microcavity 305 through the injection hole 307. Thereafter, as the curing process progresses and a solution component is evaporated, the alignment material remains on an inner wall of the microcavity 305 to form the alignment layers 11 and 21.

Next, a liquid crystal material that includes the liquid crystal molecules 310 is injected into the microcavity 305 through the injection hole 307, for example, by using an inkjet method and the like.

Figure 16:
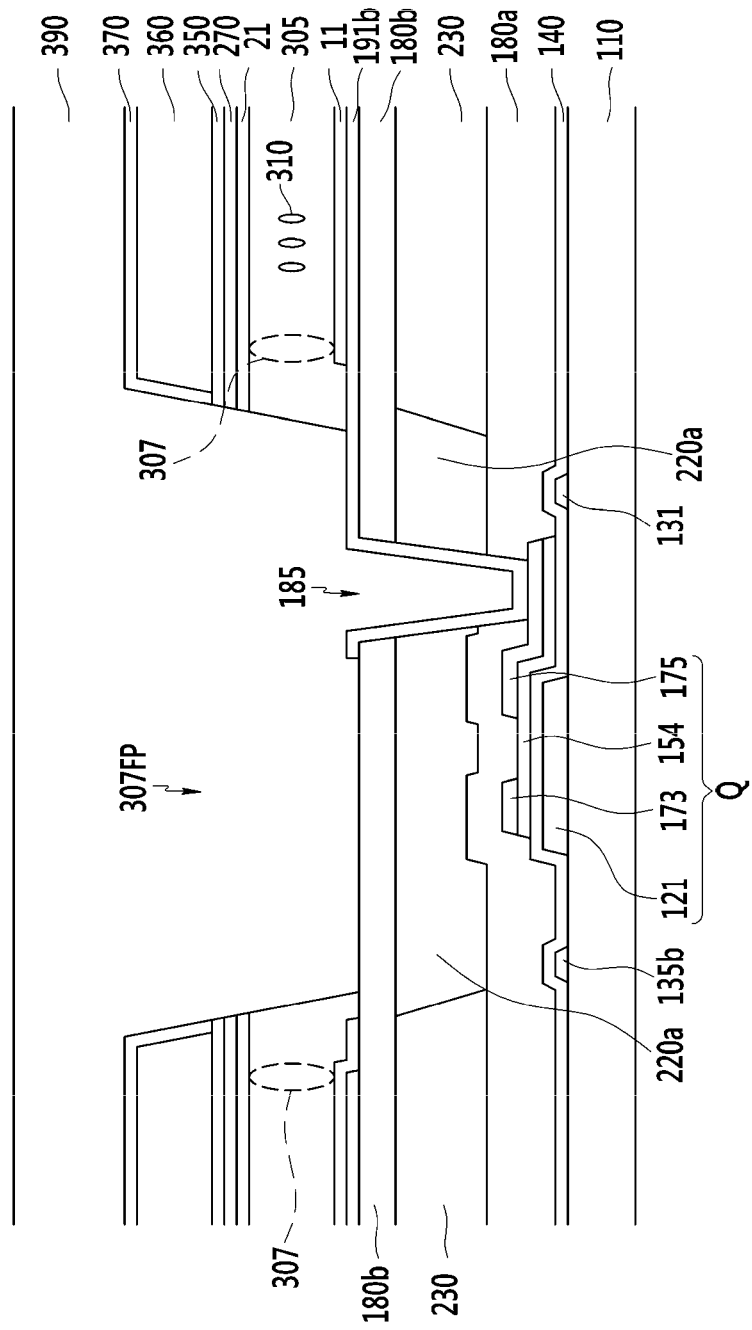

Referring to FIG. 16, the capping layer 390 may be formed by depositing a material that does not react with the liquid crystal molecules 310 onto the upper insulating layer 370. The capping layer 390 covers the injection hole 307 where the microcavity 305 is exposed to the outside and seals the microcavity 305.

Next, although not illustrated, polarizers may be further attached onto the upper and lower surfaces of the display device. The polarizers may include a first polarizer and a second polarizer. The first polarizer may be attached onto the lower surface of the substrate 110, and the second polarizer may be attached onto the capping layer 390.

While the present system and method have been described in connection with exemplary embodiments, it is understood that the present system and method are not limited to the disclosed embodiments.

<Description of symbols>

| | |
|---|---|
| 11, 21: Alignment layer | 110: Substrate |
| 121: Gate line | 124: Gate electrode |
| 131: Storage electrode line | 140: Gate insulating layer |
| 151: Semiconductor | 171: Data line |
| 173: Source electrode | 175: Drain electrode |
| 180a, 180b: Insulating layer | 185: Contact hole |
| 191: Pixel electrode | 220, 220a, 220b: Light blocking member |
| 270: Common electrode | 300, 300a: Sacrificial layer |
| 300b: Separating member | 305: Microcavity |
| 307: Injection hole | 310: Liquid crystal molecule |
| 350: Lower insulating layer | 360: Roof layer |
| 370: Upper insulating layer | 390: Capping layer |

What is claimed is:

1. A display device, comprising:
a substrate on which a gate line, a data line, and a thin film transistor are positioned;
an insulating layer positioned on the thin film transistor;
a pixel electrode positioned on the insulating layer and connected to the thin film transistor;
a roof layer that overlaps the substrate;
a common electrode that includes a first portion and a second portion;
a liquid crystal layer positioned in a microcavity that overlaps the pixel electrode; and
a separating member that is positioned on the insulating layer and overlaps the data line lengthwise,
wherein the first portion of the common electrode is positioned between the microcavity and the roof layer, and the second portion of the common electrode is positioned between the separating member and the roof layer.

2. The display device of claim 1, wherein:
the separating member is positioned so that a lower surface contacts the insulation layer and an upper surface contacts the second portion of the common electrode.

3. The display device of claim 2, wherein:
the second portion of the common electrode further contacts a side surface of the separating member.

4. The display device of claim 1, wherein:
the upper surface and the side surfaces of the separating member are substantially covered by the roof layer.

5. The display device of claim 4, wherein:
a height of the separating member is the same as or smaller than a height of the microcavity.

6. The display device of claim 4, wherein:
a width of the separating member is the same as or larger than a width of the data line that overlaps the separating member.

7. The display device of claim 4, wherein:
the common electrode includes a third portion that contacts the insulating layer in a region between the microcavity and the separating member.

8. The display device of claim 7, further comprising:
a lower insulating layer positioned between the common electrode and the roof layer.

* * * * *